(12) United States Patent
Kitamura et al.

(10) Patent No.: US 7,928,652 B2
(45) Date of Patent: Apr. 19, 2011

(54) ORGANIC EL EMITTING LAYER HAVING SPECIFIC CONCENTRATION PROFILE

(75) Inventors: Kazuki Kitamura, Ishikawa-gun (JP); Tetsuo Ishida, Kanazawa (JP); Mitsugu Tamekawa, Hakusan (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 1267 days.

(21) Appl. No.: 11/459,241

(22) Filed: Jul. 21, 2006

(65) Prior Publication Data

US 2007/0024185 A1  Feb. 1, 2007

(30) Foreign Application Priority Data

Jul. 29, 2005  (JP) .................... 2005-221591

(51) Int. Cl.
*H01J 1/62* (2006.01)
*H01L 33/00* (2010.01)

(52) U.S. Cl. .............. 313/506; 252/301.16; 257/101; 445/24

(58) Field of Classification Search ............ 252/301.16; 313/498–512; 315/169.3, 169.4; 257/40, 257/79, 101; 428/690; 427/66
See application file for complete search history.

(56) References Cited

U.S. PATENT DOCUMENTS

| 7,572,523 B2 * | 8/2009 | Igarashi | 428/690 |
| 7,696,682 B2 * | 4/2010 | Kim et al. | 313/503 |
| 2002/0025419 A1 * | 2/2002 | Lee et al. | 313/506 |
| 2002/0086180 A1 * | 7/2002 | Seo et al. | 313/506 |
| 2002/0146589 A1 * | 10/2002 | Akiyama et al. | 428/690 |
| 2002/0197511 A1 * | 12/2002 | D'Andrade et al. | 257/102 |
| 2003/0232563 A1 * | 12/2003 | Kamiyama et al. | 445/24 |
| 2005/0046337 A1 * | 3/2005 | Chin et al. | 313/504 |
| 2005/0238918 A1 * | 10/2005 | Igarashi | 428/690 |
| 2005/0260440 A1 * | 11/2005 | Seo et al. | 313/506 |
| 2006/0125379 A1 * | 6/2006 | Liu et al. | 313/504 |
| 2006/0188746 A1 * | 8/2006 | Iou | 257/101 |
| 2006/0192482 A1 * | 8/2006 | Igarashi et al. | 313/504 |
| 2007/0145384 A1 * | 6/2007 | Gardner et al. | 257/79 |

FOREIGN PATENT DOCUMENTS

JP    2003-157973    5/2003

* cited by examiner

*Primary Examiner* — Peter Macchiarolo
(74) *Attorney, Agent, or Firm* — Oblon, Spivak, McClelland, Maier & Neustadt, L.L.P.

(57) ABSTRACT

An organic EL element includes a pair of electrodes and an emitting layer interposed therebetween. The emitting layer is made of a mixture containing a host material and a dopant material. In the emitting layer, a concentration profile of the dopant material along a thickness direction includes at least two relative maximums or at least two relative minimums.

16 Claims, 6 Drawing Sheets

ORGANIC EL EMITTING LAYER HAVING SPECIFIC CONCENTRATION PROFILE

CROSS-REFERENCE TO RELATED APPLICATIONS

This application is based upon and claims the benefit of priority from prior Japanese Patent Application No. 2005-221591, filed Jul. 29, 2005, the entire contents of which are incorporated herein by reference.

BACKGROUND OF THE INVENTION

1. Field of the Invention

The present invention relates to an organic electroluminescent (hereinafter referred to as EL) element, an organic EL display, and a method of manufacturing an organic EL display.

2. Description of the Related Art

An organic EL element has a structure in which an organic layer including an emitting layer is interposed between a pair of electrodes. The emitting layer normally made of a mixture containing a host material and a dopant material. The emitting layer can be formed by vacuum evaporation as described in JP-A 2003-157973 (KOKAI), for example.

In view of increasing the degree of luminous efficiency, it is ideal to set the concentration of the dopant material at an optimum value in all the parts of the emitting layer. However, under normal circumstances, the concentration of the dopant material monotonically increases or monotonically decreases along the thickness of the emitting layer. Therefore, the concentration of the dopant material can be optimized only on a single plane that is parallel with a surface of the emitting layer. For this reason, most of organic EL elements are low in the degree of luminous efficiency.

BRIEF SUMMARY OF THE INVENTION

According to a first aspect of the present invention, there is provided an organic EL element comprising first and second electrodes and an emitting layer interposed therebetween, the emitting layer being made of a mixture containing a host material and a dopant material, and a concentration profile of the dopant material along a thickness direction in the emitting layer including at least two relative maximums or at least two relative minimums.

According to a second aspect of the present invention, there is provided an organic EL display comprising pixels, each of the pixels including the organic EL element according to the first aspect.

According a third aspect of the present invention, there is provided a method of manufacturing an organic EL element comprising first and second electrodes and an emitting layer interposed therebetween, comprising alternately carrying out first and second operations each at least two times while discharging a vaporized host material and a vaporized dopant material toward the first electrode from first and second nozzles, respectively, to form the emitting layer on the first electrode, each of the first and second operations including relatively moving the first and second nozzles with respect to the first electrode in a relative movement direction parallel to an alignment direction of the first and second nozzles, the alignment direction and the relative movement direction being equal to each other in one of the first and second operations, and the alignment direction and the relative movement direction being opposite to each other in the other of the first and second operations, and forming the second electrode on the emitting layer.

DETAILED DESCRIPTION OF THE INVENTION

An embodiment of the present invention will be described below in detail with reference to the drawings. In the drawings, components having the same or similar function are denoted by the same reference symbol and duplicate descriptions will be omitted.

Figure 1:
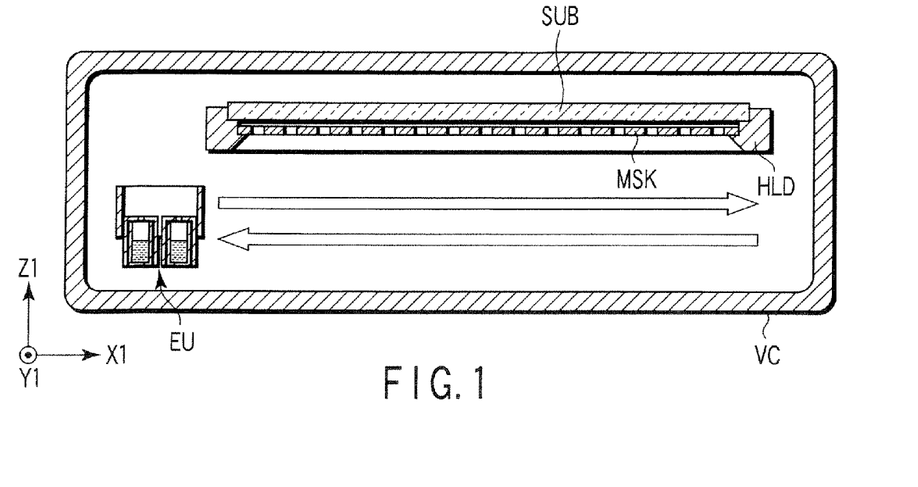
FIG. 1 is a sectional view schematically showing a vacuum evaporator that can be used in the process according to an embodiment of the present invention.
Figure 2:
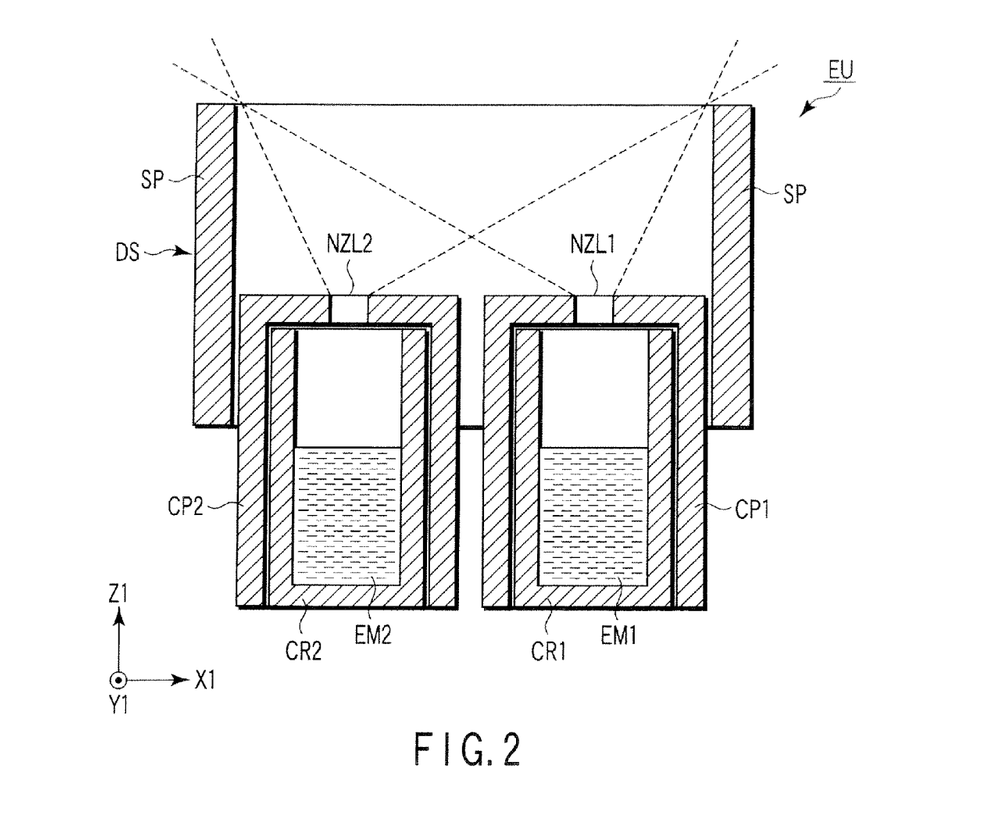
FIG. 2 is a sectional view schematically showing the evaporation unit included in the vacuum evaporator shown in FIG. 1.

FIG. 1 is a sectional view schematically showing a vacuum evaporator that can be used in the process according to an embodiment of the present invention. FIG. 2 is a sectional view schematically showing the evaporation unit included in the vacuum evaporator shown in FIG. 1.

The vacuum evaporator shown in FIG. 1 includes a vacuum chamber VC to which an evacuation system is connected. Typically, the vacuum chamber VC is incorporated in a single-substrate processing apparatus including a multi-chamber system.

In the vacuum chamber VC, a substrate holder HLD, an evaporation unit EU, and a thickness sensor (not shown) are placed.

The substrate holder HLD detachably holds a substrate AS such that a film-formed surface of the substrate AS faces the evaporation unit EU. In this embodiment, the substrate holder HLD also serves as a mask holder for holding a mask MSK.

The thickness sensor includes a structure in which electrodes are placed on both sides of a quartz plate, and constitutes a quartz thickness monitor with a controller (not shown), for example.

The thickness sensor is adjacent to the substrate AS in the X1 direction. Typically, the thickness sensor is placed such that its detecting portion is located on or near the level of the film-formed surface.

As shown in FIG. 2, the evaporation unit EU includes crucibles CR1 and CR2, heaters (not shown), caps CP1 and CP2, and a deposition shield DS.

Each of the crucibles CR1 and CR2 has a shape extending in the Y1 direction that is perpendicular to the X1 and Z1 directions. The crucibles CR1 and CR2 contain evaporation materials EM1 and EM2, respectively. The crucibles CR1 and CR2 are made of quartz, metal materials, carbon and the like.

The heaters are, for example, electrical resistance heaters. The heaters heat the crucibles CR1 and CR2 to vaporize the evaporation materials EM1 and EM2 contained therein. The electric powers to be supplied to the heaters are controlled by the controller (not shown) based on an output of the thickness sensor (not shown).

The caps CP1 and CP2 cover the openings of the crucibles CR1 and CR2, respectively. Each of the caps CP1 and CP2 is provided with a slit extending in the Y1 direction or through-holes arranged in the Y1 direction. The part of the cap CP1 provided with the slit or the through-holes serves as a nozzle NZL1 that ejects the vaporized evaporation material EM1. The part of the cap CP2 provided with the slit or the through-holes serves as a nozzle NZL2 that ejects the vaporized evaporation material EM2. As materials of the caps CP1 and CP2, quartz, metal materials, carbon and the like can be used.

The deposition shield DS includes a pair of shield plates SP. Main surfaces of the shield plates SP is parallel with the Y1 direction and intersect the X1 direction. The shield plates SP sandwich the nozzles NZL1 and NZL2. The shield plates SP serve the function of controlling the flow direction of the evaporation material EM1 ejected from the nozzle NZL1 and the flow direction of the evaporation material EM2 ejected from the nozzle NZL2.

The vacuum evaporator further includes a moving mechanism (not shown) and the controller (not shown).

The moving mechanism relatively moves the evaporation unit EU with respect to the substrate AS in the X1 direction. Typically, the moving mechanism moves the evaporation unit EU in the X1 direction.

The controller is connected to the moving mechanism, the thickness sensor and the heaters. The controller controls the operation of the moving mechanism. The controller further controls the electric powers to be supplied to the heaters based on the output of the thickness sensor.

Figure 3:
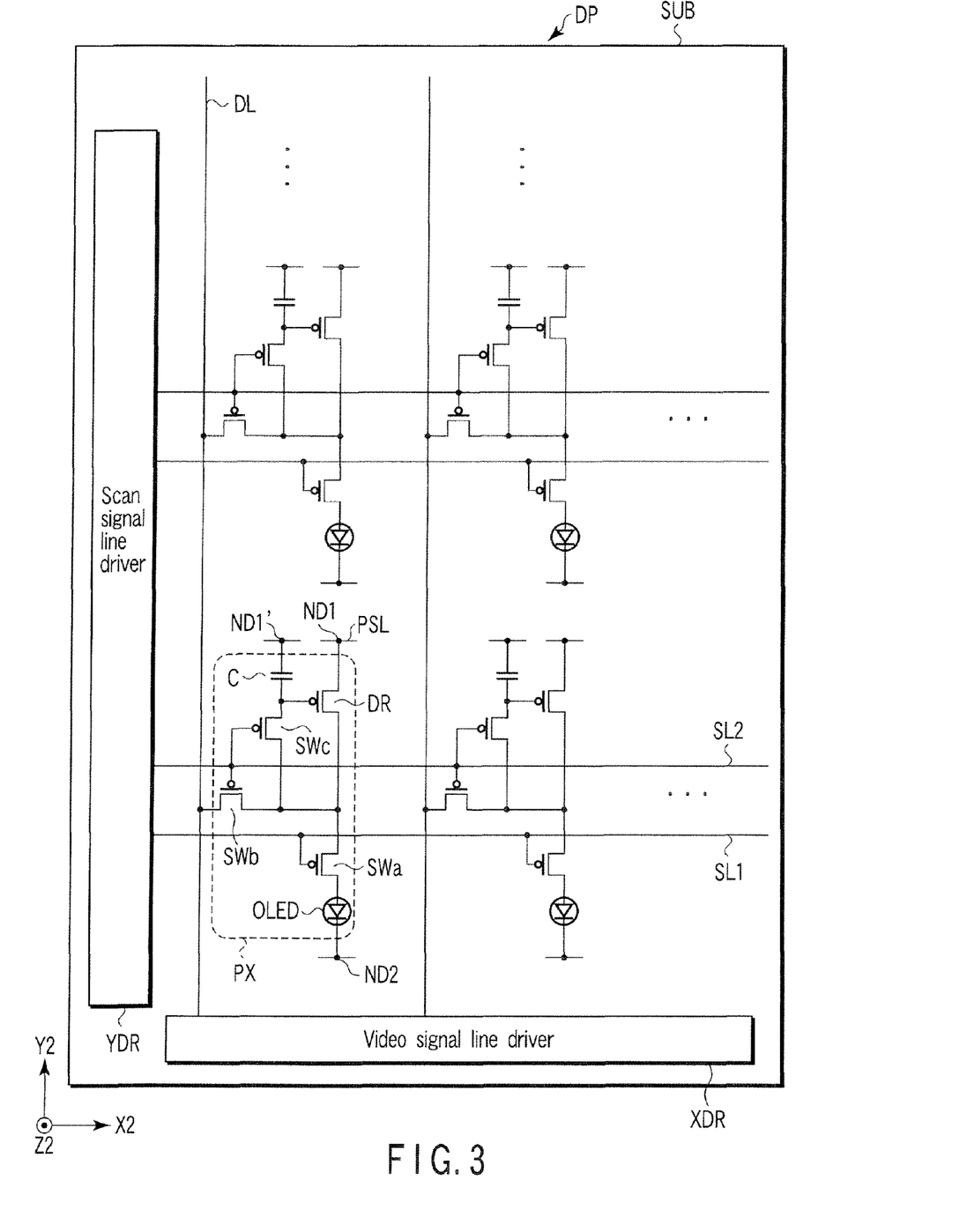
FIG. 3 is a plan view schematically showing an organic EL display that can be manufactured by the process according to an embodiment of the present invention.
Figure 4:
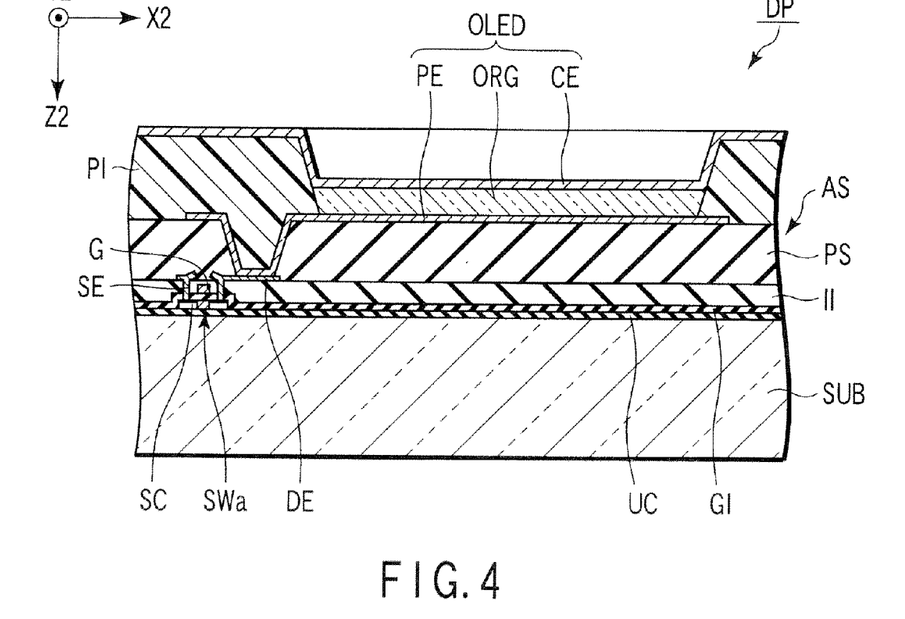
FIG. 4 is a sectional view schematically showing a display panel that can be used in the organic EL display shown in FIG. 3.
Figure 5:
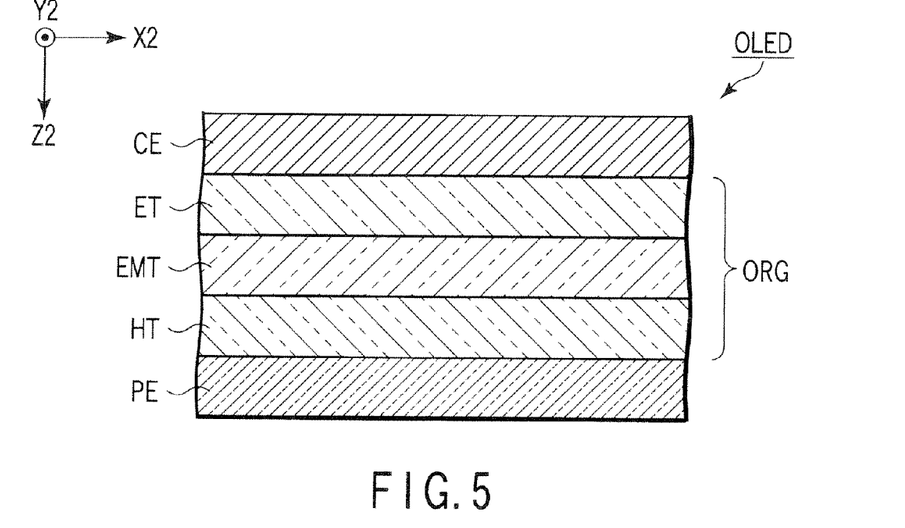
FIG. 5 is a sectional view schematically showing an example of an organic EL element that the display panel shown in FIG. 4 can include.

FIG. 3 is a plan view schematically showing an organic EL display that can be manufactured by the process according to an embodiment of the present invention. FIG. 4 is a sectional view schematically showing a display panel that can be used in the organic EL display shown in FIG. 3. FIG. 5 is a sectional view schematically showing an example of an organic EL element that the display panel shown in FIG. 4 can include. In FIG. 4, the display panel is drawn such that its display surface, i.e., the front surface or light-emitting surface, faces downwardly and its back surface faces upwardly.

The display is a bottom emission organic EL display that employs an active matrix driving method. As shown in FIG. 3, the organic EL display includes a display panel DP, a video signal line driver XDR, and a scan signal line driver YDR.

As shown in FIGS. 3 and 4, the display panel DP includes an insulating substrate SUB such as glass substrate.

On the substrate SUB, an undercoat layer UC is formed as shown in FIG. 4. For example, the undercoat layer UC is formed by sequentially stacking an $SiN_x$ layer and an $SiO_x$ layer on the substrate SUB.

On the undercoat layer UC, semiconductor layers SC are arranged. Each semiconductor SC is, for example, a polysilicon layer that includes a p-type region and an n-type region.

On the undercoat layer UC, bottom electrodes (not shown) are further arranged. The bottom electrodes are, for example, $n^+$-type polysilicon layers.

The semiconductor layers SC and the bottom electrodes are covered with the gate insulator GI. The gate insulator GI can be formed, for example, by using tetraethyl orthosilicate (TEOS).

On the gate insulator GI, the scan signal lines SL1 and SL2 shown in FIG. 3 are arranged. As shown in FIG. 3, the scan signal lines SL1 and SL2 extend in a direction (X2 direction) along rows of the pixels PX, which are described later, and are alternately arranged in a direction (Y2 direction) along columns of the pixels PX. The scan signal lines SL1 and SL2 are made of MoW, for example.

On the gate insulator GI, top electrodes (not shown) are further arranged. The top electrodes are made of MoW, for example. The top electrodes can be formed in the same step as that for the scan signal lines SL1 and SL2.

The scan signal lines SL1 and SL2 intersect the semiconductor layers SC, and the intersection portions form thin-film transistors. In addition, the top electrodes intersect the semiconductor layers, and the intersection portions also form thin-film transistors. Specifically, the thin-film transistors formed by the intersection portions of the scan signal lines SL1 and the semiconductor layers SC are the output control switches SWa shown in FIGS. 3 and 4. The thin-film transistors formed by the intersection portions of the scan signal lines SL2 and the semiconductor layers SC are the diode-connecting switches SWc and the video signal supply control switches SWb shown in FIG. 3. The thin-film transistors formed by the intersection portions of the top electrodes and the semiconductor layers SC are the drive control elements DR shown in FIG. 3.

Note that in the present embodiment, the drive control elements DR and the switches SWa to SWc are top-gate type p-channel thin-film transistors. Note also that the portion denoted by the reference symbol G in FIG. 4 is the gate of the switch SWa.

The top electrodes face the bottom electrodes. The top electrodes, the bottom electrodes, and the insulating film GI interposed therebetween form capacitors C shown in FIG. 3.

The gate insulator GI, the scan signal lines SL1 and SL2, and the top electrodes are covered with the interlayer insulating film II shown in FIG. 4. For example, the interlayer insulating film II is an $SiO_x$ layer formed by plasma chemical vapor deposition (CVD).

On the interlayer insulating film II, the video signal lines DL and power supply lines PSL shown in FIG. 3 are formed. Source electrodes SW and drain electrodes DE shown in FIG. 4 are further formed on the interlayer insulating film II.

As shown in FIG. 1, the video signal lines DL extend in the Y2 direction and are arranged in the X2 direction. The video signal lines DL are connected to the drains of the video signal supply control switches SWb included in the pixels PX.

The power supply lines PSL extend in the Y2 direction and are arranged in the X2 direction in this embodiment. The power supply lines PSL are connected to the sources of the drive control elements DR.

The source electrodes SE and the drain electrodes DE are connected to the sources and drains of the thin-film transistors via contact holes formed in the interlayer insulating film II and the gate insulator GI. The source electrodes SE and the drain electrodes DE connect the elements together included in each pixel PX.

For example, the video signal lines DL, the power supply lines PSL, source electrodes SE, and drain electrodes DE have a three-layer structure of Mo/Al/Mo. These components can be formed in the same step.

The video signal lines DL, the power supply lines PSL, the source electrodes SE, and the drain electrodes DE are covered with the passivation layer PS shown in FIG. 4. The passivation layer PS is made of $SiN_x$, for example.

On the passivation layer PS, pixel electrodes PE shown in FIGS. 2 and 3 are arranged. Each pixel electrode PE is connected to the drain electrode DE via a contact hole formed in the passivation layer PS.

In this embodiment, the pixel electrodes PE are light-transmissible front electrodes. Also, in this embodiment, the pixel electrodes PE are anodes. As material of the pixel electrodes PE, for example, transparent conductive oxides such as indium tin oxide (ITO) can be used.

On the passivation layer PS, an insulating partition layer PI is further formed. The insulating partition layer PI is provided with through-holes at positions corresponding to the pixel electrodes PE. Alternatively, the insulating partition layer PI is provided with slits at positions corresponding to columns or rows of the pixel electrodes PE. As an example, it is supposed that through-holes are formed in the insulating partition layer PI at positions corresponding to the pixel electrodes PE.

The insulating partition layer PI is, for example, an organic insulating layer. The insulating partition layer PI can be formed by using photolithography technique, for example.

On the pixel electrodes PE, organic layers ORG including emitting layers EMT shown in FIG. 5 are formed as active layers. The emitting layers EMT are, for example, thin film containing a luminescent organic compound that emits red, green, or blue light. In addition to the emitting layer EMT, each organic layer ORG may include a hole injection layer (not shown), a hole transporting layer HT, a hole blocking layer (not shown), an electron transporting layer (ET), and an electron injection layer (not shown).

The emitting layers EMT are made of a mixture containing a host material and a dopant material.

As the host material, organic materials or organometallic compounds such as anthracenes, amines, styryls, siloles, azoles, polyphenyls, and metal complexes can be used. For example, as the host material, diphenylanthracene derivative, biscarbazole, stylylamine, distylylarylene, oxazole, oxadiazole, benzoimidazole, tris(8-hydroxyquinolinato)aluminum ($Alq_3$) and the like may be used.

As the dopant material, organic materials or organometallic compounds such as dicyanomethylenepyrans, dicyanos, phenoxazones, thioxantens, rubrenes, stylyls, coumarins, quinacridones, condensed aromatics, and heavy-metal complexes can be used. For example, as the dopant material, coumarin, rubrene, perylene, azathioxanten, N-methylquinacridone, diphenylnaphtacene, perflanten, iridium complex with three phenylpyridines as ligands ($Ir(ppy)_3$) and the like may be used.

The insulating partition layer PI and the organic layers ORG are covered with a counter electrode CE shown in FIGS. 4 and 5. In this embodiment, the counter electrode CE is a common electrode shared among the pixels PX. Also, in this embodiment, the counter electrode CE is a light-reflective cathode serving as a back electrode. For example, an electrode wire (not shown) is formed on the layer on which the video signal lines DL are formed, and the counter electrode CE is electrically connected to the electrode wire via a contact hole formed in the passivation layer PS and insulating partition layer PI. Each organic EL element OLED is composed of the pixel electrode PE, organic layer ORG, and counter electrode CE.

As shown in FIG. 3, each pixel PX includes the drive control element DR, the switches SWa to SWc, the organic EL element OLED, and the capacitor C. As described above, in this embodiment, the drive control element DR and the switches SWa to SWc are p-channel thin-film transistor.

The drive control element DR, the output control switch SWa, and the organic EL element OLED are connected in series between a first power supply terminal ND1 and a second power supply terminal ND2 in this order. In this embodiment, the power supply terminal ND1 is a high-potential power supply terminal, and the power supply terminal ND2 is a low-potential power supply terminal.

Specifically, the source of the drive control element DR is connected to the power supply terminal ND1, and the counter electrode CE of the organic EL element OLED is connected to the power supply terminal ND2. The output control switch SWa is connected between the drain of the drive control element DR and the pixel electrode PE of the organic EL element OLED, and its gate is connected to the scan signal line SL1.

The capacitor C is connected between a constant potential terminal ND1' and the gate of the drive control element DR. In this embodiment, the bottom electrode of the capacitor C is connected to the power supply line PSL, and the top electrode of the capacitor C is connected to the gate of the drive control element DR.

The video signal supply control switch SWb is connected between the video signal line DL and the drain of the drive control element DR. The gate of the video signal supply control switch SWb is connected to the scan signal line SL2.

The diode-connecting switch SWc is connected between the drain and gate of the drive control element DR. The gate of the diode-connecting switch SWb is connected to the scan signal line SL2.

Note that the structure of the display panel DP from which the organic layer ORG and the counter electrode CE are omitted corresponds to an array substrate.

The video signal line driver XDR and the scan signal line driver YDR are connected to the display panel DP in the chip-on-glass (COG) manner. Instead, the video signal line driver XDR and the scan signal line driver YDR may be connected to the display panel DP by using the tape carrier package (TCP).

Video signal lines DL are connected to the video signal line driver XDR. In this embodiment, the power supply lines PSL are further connected to the video signal line driver XDR. The video signal line driver XDR outputs current signals as video signals to the video signal lines DL, and outputs a supply voltage to the power supply lines PSL.

The scan signal lines SL1 and SL2 are connected to the scan signal line driver YDR. The scan signal line driver YDR outputs voltage signals as first and second scan signals to the scan signal lines SL1 and SL2, respectively.

When an image is to be displayed on the organic EL display, the scan signal lines SL2 are sequentially energized. That is, the pixels PX are scanned or selected on a line-by-line basis. During a write period for writing video signals on the pixels PX in a certain row, the scan signal line driver YDR outputs a scan signal (OFF) for opening the switches SWa as a voltage signal to the scan signal line SL1 to which the pixels PX are connected, and then, outputs a scan signal (ON) for closing the switches SWb and SWc as a voltage signal to the scan signal line SL2 to which the pixels PX are connected. In this state, the video signal line driver XDR outputs video signals as current signals to the video signal lines to which the pixels PX are connected, so as to set the gate-to-source voltages of the drive control elements DR at magnitude corresponding to the video signals. Subsequently, the scan signal line driver YDR outputs a scan signal SL2 as a voltage signal (OFF) for opening the switches SWb and SWc as a voltage signal to the scan signal line SC2 to which the pixels PX are connected, and then, outputs a scan signal (ON) for closing the switches SWa as a voltage signal to the scan signal line SL1 to which the pixels PX are connected.

During an effective display period over which the switches SWa are closed (ON), drive currents flow through the organic EL elements OLED at magnitude corresponding to the gate-to-source voltages of the drive control elements DR. The organic EL elements emit light at luminance corresponding to the magnitude of the drive currents.

The organic EL display can be manufactured, for example, by the following method.

First, the array substrate is prepared, and the organic layers ORG and the counter electrode CE are sequentially formed on the pixel electrodes of the array substrate. As described later, the emitting layers EMT included in the organic layer ORG are formed by using the vacuum evaporator shown in FIG. 1. Note that a layer or layers other than the emitting layer EMT included in the organic layers ORG and the counter electrode CE are typically formed by vacuum evaporation. Then, the organic EL elements OLED thus obtained are sealed to complete the display panel DP. Thereafter, the video signal line driver XDR and the scan signal line driver YDR are connected to the display panel DP to obtain the organic EL display.

The emitting layers EMT are formed, for example, by the following method.

First, the vacuum chamber VC is evacuated. At this time, the crucible CR1 contains a host material as the evaporation material EM1 and the crucible CR2 contains a dopant material as the evaporation material EM2.

Next, electric power is supplied to the heaters (not shown) so as to sufficiently raise the temperatures of the crucibles CR1 and CR2. The temperatures of the crucibles CR1 and CR2 are raised, for example, to 50° C. or lower, and typically to 300° C. or higher and 500° C. or lower. Thus, the host material EM1 in the crucible CR1 and the dopant material EM2 in the crucible CR2 are vaporized.

The vaporized host material EM1 in the crucible CR1 and the vaporized dopant material EM2 in the crucible CR2 are ejected from the nozzles NZL1 and NZL2, respectively. The host material EM1 ejected from the nozzle NZL1 and the dopant material EM2 ejected from the nozzle NZL2 are deposited on the detecting portion of the thickness sensor. The controller controls the magnitude of electric power supplied to the heaters based on the output from the thickness sensor. Under this feedback control, the evaporation rates of the host material EM1 and the dopant material EM2 are set at values almost equal to the target values.

Next, the array substrate AS with the hole transporting layer HT formed on the pixel electrodes is carried into the vacuum chamber VC while maintaining a vacuum. In the vacuum chamber VC, the substrate holder HLD holds the array substrate AS such that the insulating partition layer PI faces downwardly. That is, the substrate holder HLD holds the array substrate AS such that the Z2 direction in FIG. 4 coincidences with the Z1 direction in FIG. 1.

Then, the first operation is carried out. That is, the evaporation unit EU is moved in the X1 direction at a constant speed while ejecting the host material EM1 and the dopant material EM2 from the nozzles NZL1 and NZL2, respectively. The deposition shield controls the flow direction of the host material EM1 ejected from the nozzle NZL1 and the flow direction of the dopant material EM2 ejected from the nozzle NZL2. Under this control, the host material EM1 and the dopant material EM2 passes through the through-holes formed in the mask MSK and are deposited on the hole transporting layer HT.

After the evaporation unit has passed the front of the array substrate AS, the second operation is carried out. That is, the evaporation unit EU is moved in the opposite direction at a constant speed while ejecting the host material EM1 and the dopant material EM2 from the nozzles NZL1 and NZL2, respectively. The deposition shield controls the flow direction of the host material EM1 ejected from the nozzle NZL1 and the flow direction of the dopant material EM2 ejected from the nozzle NZL2. Under this control, the host material EM1 and the dopant material EM2 passes through the through-holes formed in the mask MSK and are deposited on the hole transporting layer HT.

The first and second operations are alternately carried out each at least two times. Thus, the emitting layer EMT is obtained.

After the film formation, the array substrate AS is carried out of the vacuum chamber VC while maintaining a vacuum, and the evaporation unit EU is moved to a position below the thickness sensor. Subsequently, the second array substrate AS is carried into the vacuum chamber VC, and the above feedback control is executed. Then, the same film formation as that performed on the first array substrate AS is performed on the second array substrate AS. Each array substrate AS thereafter is processed by the same method as described above.

The emitting layer EMT obtained by this method has the concentration profile of the dopant material along its thickness direction that includes at least two relative maximums or at least two relative minimums. This will be explained with reference to FIGS. 6 to 9.

Figure 6:
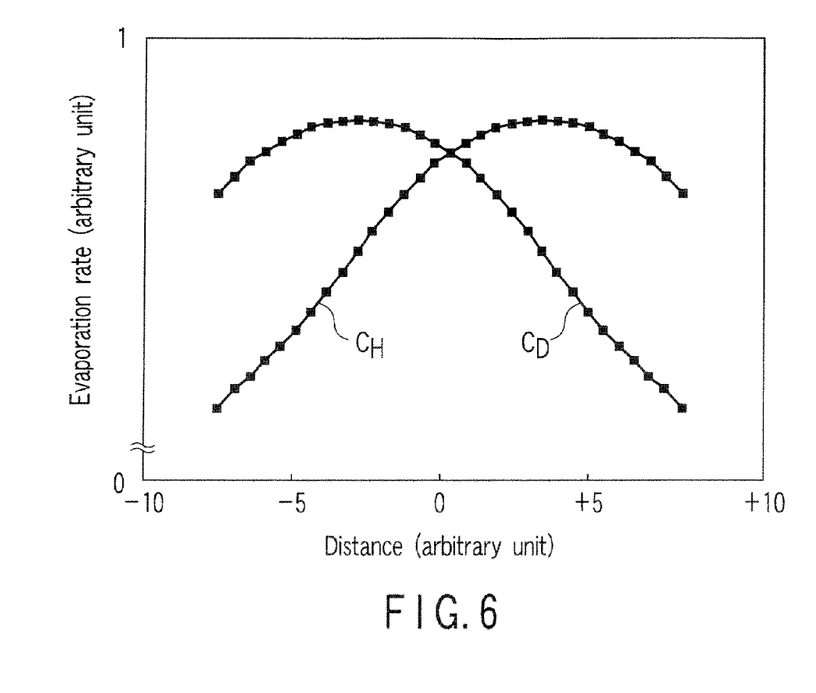
FIG. 6 is a graph showing an example of a relation between a relative position of a film-formed surface with respect of the evaporation unit and an evaporation rate.

FIG. 6 is a graph showing an example of a relation between a relative position of a film-formed surface with respect of the evaporation unit and an evaporation rate. In the figure, the abscissa represents a distance along the X1 direction from a reference point on the film-formed surface, while the ordinate represents the evaporation rate. Note that the reference point is the position on the film-formed surface where the distance from the nozzle NZL1 is equal to the distance from the nozzle NZL2. Also, in FIG. 6, the curve $C_H$ represents the evaporation rate of the host material EM1, while the curve $C_D$ represents the evaporation rate of the dopant material EM2.

The data shown as the curve $C_H$ was obtained by alternately performing the measurement of the evaporation rate with use of the thickness sensor in the state that the evaporation unit EU is standing still and the shift of the evaporation unit EU in the X1 direction while vaporizing only the host material EM1. On the other hand, the shown as the curve $C_D$ was obtained by alternately performing the measurement of the evaporation rate with use of the thickness sensor in the state that the evaporation unit EU is standing still and the shift of the evaporation unit EU in the X1 direction while vaporizing only the dopant material EM2.

Note that the data obtained by alternately performing the measurement of the evaporation rate with use of the thickness sensor in the state that the evaporation unit EU is standing still and the shift of the evaporation unit EU in the X1 direction while simultaneously vaporizing the host material EM1 and the dopant material EM2 was almost equal to the sum of the data shown as the curve $C_H$ and the data shown as the curve $C_D$. Therefore, it is presumed that the evaporation rate profiles of the host material EM1 and the dopant material EM2 are almost equal to the curves $C_H$ and $C_D$, respectively, when the host material EM1 and the dopant material EM2 are vaporized simultaneously.

The evaporation rate of the host material EM1 is large at or near the front of the nozzle NZL1 and decreases with the distance therefrom. On the other hand, the evaporation rate of the host material EM2 is large at or near the front of the nozzle NZL2 and decreases with the distance therefrom. Since the nozzles NZL1 and NZL2 are arranged in the X1 direction, the position at which the evaporation rate of the host material EM1 reaches its peak does not agree with the position at which the evaporation rate of the dopant material EM2 reaches its peak as shown in FIG. 6. Therefore, the ratio of the dopant material in the deposit on the film-formed surface changes according to the position along the X1 direction.

Figure 7:
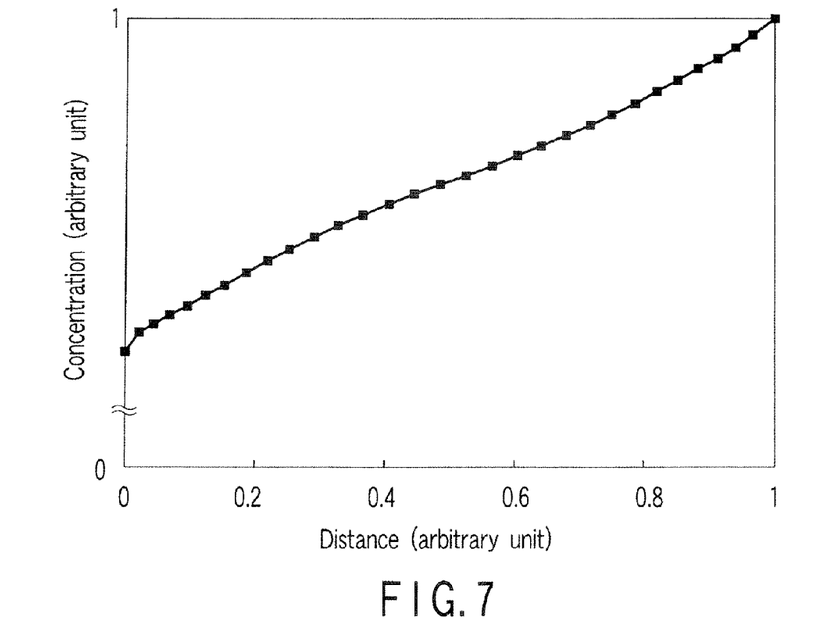
FIG. 7 is a graph showing an example of a concentration profile of a dopant material in an emitting layer along its thickness when the emitting layer is formed only by the first operation.

FIG. 7 is a graph showing an example of a concentration profile of a dopant material in an emitting layer along its thickness when the emitting layer is formed only by the first operation. In the figure, the abscissa represents a distance from the film-formed surface, while the ordinate represents the concentration of the dopant material.

The emitting layer EMT that has the concentration profile of the dopant material shown in FIG. 7 can be obtained by moving the evaporation unit EU, which allows the host material EM1 and the dopant material EM2 to be deposited at the evaporation rates shown in FIG. 6 when the unit EU is at a standstill, in the X1 direction at a constant speed only one time. That is, in the emitting layer obtained by moving the evaporation unit EU in the X1 direction only one time, the concentration of the dopant material monotonically increases or monotonically decreases along its thickness direction. Thus, the concentration of the dopant material EM2 can be optimized only on a single plane that is parallel with a surface of the emitting layer EMT.

Figure 8:
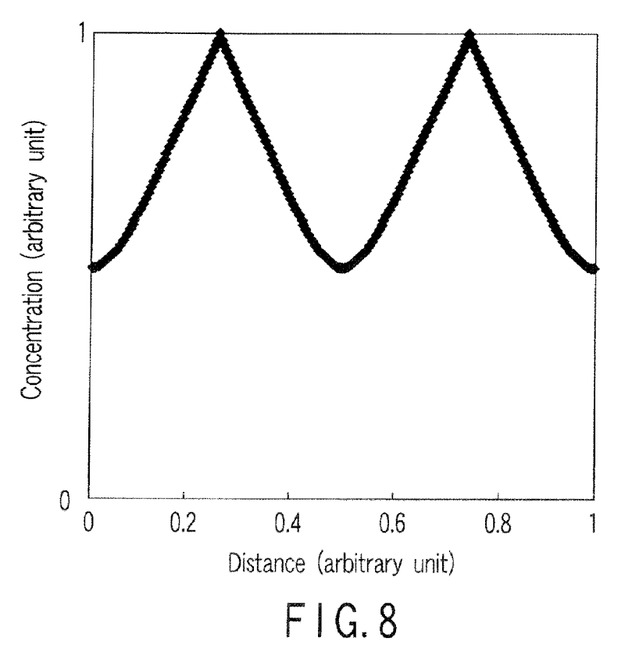
FIG. 8 is a graph showing an example of a concentration profile of a dopant material in an emitting layer along its thickness when the emitting layer is formed by alternately carrying out the first and second operations each two times.

FIG. 8 is a graph showing an example of a concentration profile of a dopant material in an emitting layer along its thickness when the emitting layer is formed by alternately carrying out the first and second operations each two times. In the figure, the abscissa represents a distance from the film-formed surface, while the ordinate represents the concentration of the dopant material.

The emitting layer having the concentration profile of the dopant material shown in FIG. 8 can be obtained by alternately carrying out the first operation that includes moving the evaporation unit EU, which allows the host material EM1 and the dopant material EM2 to be deposited at the evaporation rates shown in FIG. 6 when the unit EU is at a standstill, in the X1 direction at a constant speed and the second operation that includes moving the evaporation unit EU in the opposite direction at a constant speed each two times. That is, in the emitting layer EMT obtained by alternately carrying out the forward and backward movements of the evaporation unit EU along the X1 direction each two times, the concentration of the dopant material along the thickness direction includes two relative maximums and one relative minimum.

Thus, when the optimum value of the dopant material concentration is smaller than the relative maximums and larger than the relative minimum, the concentration of the dopant material EM2 can be optimized on four planes that are parallel with a surface of the emitting layer EMT. Therefore, when the emitting layer EMT is formed by the method explained with reference to FIG. 8, the degree of luminous efficiency of the organic EL element OLED can be increased as compared to the case where the emitting layer EMT is formed by the method explained with reference to FIG. 7.

Note that when a dopant material is used as the evaporation material EM1 and a host material is used as the evaporation material EM2 instead of using the host material as the evaporation material EM1 and the dopant material as the evaporation material EM2, the emitting layer EMT in which the concentration of the dopant material along its thickness direction includes one relative maximum and two relative minimums can be obtained.

Figure 9:
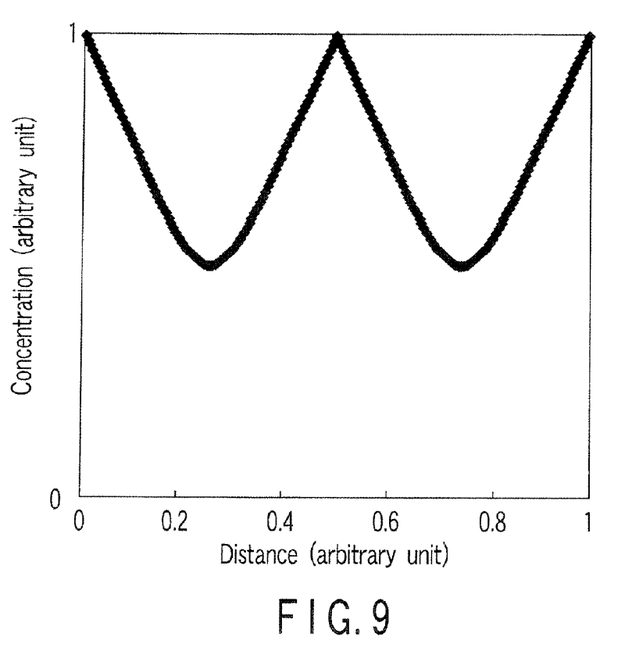
FIG. 9 is a graph showing another example of a concentration profile of a dopant material in an emitting layer along its thickness when the emitting layer is formed by alternately carrying out the first and second operations each two times.

FIG. 9 is a graph showing another example of a concentration profile of a dopant material in an emitting layer along its thickness when the emitting layer is formed by alternately carrying out the first and second operations each two times. In the figure, the abscissa represents a distance from the film-formed surface, while the ordinate represents the concentration of the dopant material.

The emitting layer EMT having the concentration profile of the dopant material shown in FIG. 9 can be obtained by the same method as that explained with reference to FIG. 8 except that the dopant material is used as the evaporation material EM1 and the host material is used as the evaporation material EM2 instead of using the host material as the evaporation material EM1 and the dopant material as the evaporation material EM2. Similar to the method explained with reference to FIG. 8, according to this method, the degree of luminous efficiency of the organic EL element OLED can be increased as compared to the case where the emitting layer EMT is formed by the method explained with reference to FIG. 7.

When the first and second operations are carried out each only one time, the degree of luminous efficiency of the organic EL element OLED can be increased as compared to the case where only the first operation is carried out one time or the case where only the second operation is carried out one time. However, in view of achieving a high degree of luminous efficiency, it is advantageous to alternately carrying out the first and second operations each at least two times. This will be explained with reference to FIG. 10.

Figure 10:
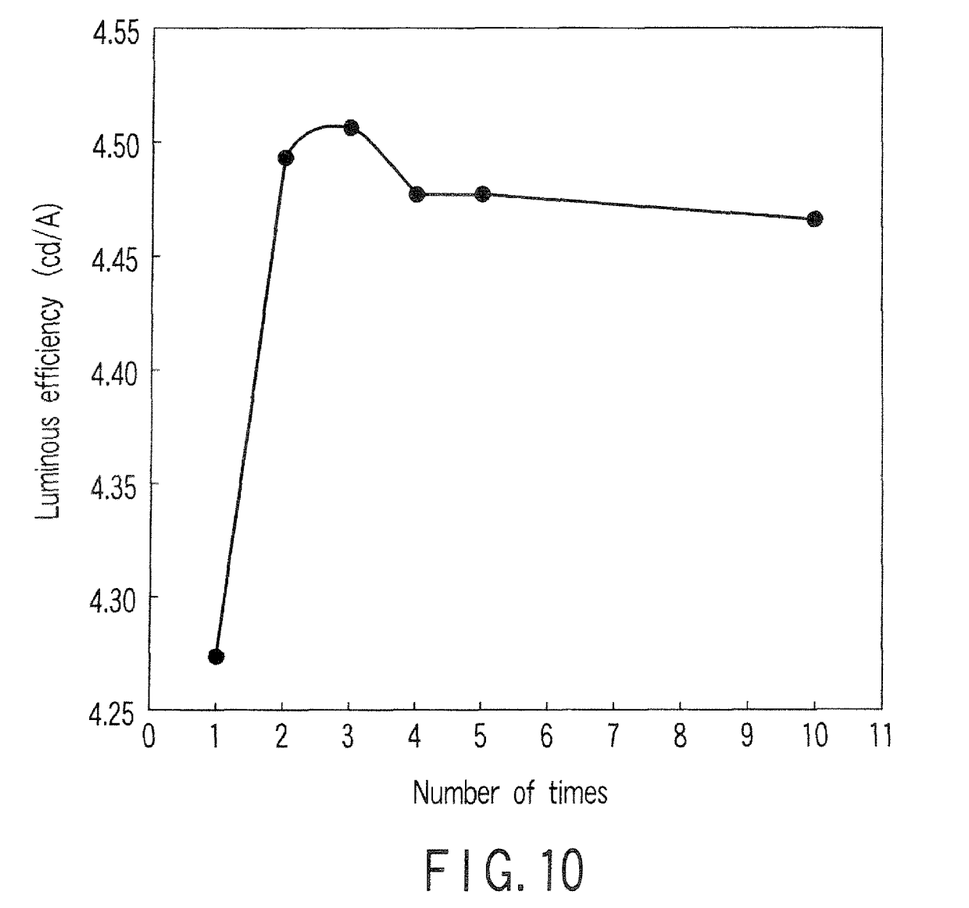
FIG. 10 is a graph showing an example of a relation between a number of times each of the first and second operations is carried out and luminous efficiency of an organic EL element.

FIG. 10 is a graph showing an example of a relation between a number of times each of the first and second operations is carried out and luminous efficiency of an organic EL element. In the figure, the abscissa represents the number of first or second operations, while the ordinate represents the degree of luminous efficiency of the organic EL element.

As shown in FIG. 10, when the first and second operations are alternately carried out each at least two times, the degree of luminous efficiency of the organic EL element OLED is markedly high as compared to the case where the first and second operations are carried out each only one time. Thus, when the first and second operations are alternately carried out each at least two times, a markedly high degree of luminous efficiency can be achieved as compared to the case where the first and second operations are carried out each only one time as well as the case where only the first or second operation is carried out one time.

Although the present embodiment employs the configuration that the evaporation unit EU is moved, the configuration that the substrate SUB is moved may be employed instead. Further, the vacuum evaporator according to the present embodiment may be incorporated in a single-substrate processing apparatus including a multi-chamber system or an in-line type batch processing apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An organic EL element comprising:
   first and second electrodes and an emitting layer interposed therebetween,
   the emitting layer being made of a mixture containing a host material and a dopant material, the dopant material being an organic material different from an organometallic compound, and
   a concentration profile of the dopant material along a thickness direction in the emitting layer including at least two relative maximums or at least two relative minimums.

2. The element according to claim 1, wherein the concentration profile includes at least two relative maximums.

3. The element according to claim 1, wherein the concentration profile includes at least two relative minimums.

4. An organic EL display comprising pixels, each of the pixels including the organic EL element according to claim 1.

5. The display according to claim 4, wherein the concentration profile includes at least two relative maximums.

6. The display according to claim 4, wherein the concentration profile includes at least two relative minimums.

7. The element according to claim 1, further comprising:
   a substrate;
   a thin-film transistor located above the substrate; and
   an insulating layer located above the thin-film transistor and including a through-hole, the first electrode being electrically connected to the thin-film transistor through the through-hole.

8. An organic EL element comprising:
   first and second electrodes and an emitting layer interposed therebetween,
   the emitting layer being made of a mixture containing a host material and a dopant material,
   the dopant material being selected from the group consisting of dicyanomethylenepyrans, dicyanos, phenoxazones, thioxantens, rubrenes, stylyls, coumarins, quinacridones, and condensed aromatics, and
   a concentration profile of the dopant material along a thickness direction in the emitting layer including at least two relative maximums or at least two relative minimums.

9. The element according to claim 8, wherein the dopant material is selected from the group consisting of coumarin, rubrene, perylene, azathioxanten, N-methylquinacridone, diphenylnaphtacene, and perflanten.

10. The element according to claim 8, wherein the concentration profile includes at least two relative maximums.

11. The element according to claim 8, wherein the concentration profile includes at least two relative minimums.

12. The element according to claim 8, further comprising:
    a substrate;
    a thin-film transistor located above the substrate; and
    an insulating layer located above the thin-film transistor and including a through-hole, the first electrode being electrically connected to the thin-film transistor through the through-hole.

13. An organic EL display comprising pixels, each of the pixels including the organic EL element according to claim 8.

14. The display according to claim 13, wherein the dopant material is selected from the group consisting of coumarin, rubrene, perylene, azathioxanten, N-methylquinacridone, diphenylnaphtacene, and perflanten.

15. The display according to claim 13, wherein the concentration profile includes at least two relative maximums.

16. The display according to claim 13, wherein the concentration profile includes at least two relative minimums.

* * * * *